(12) United States Patent
Reboh et al.

(10) Patent No.: US 10,115,590 B2
(45) Date of Patent: Oct. 30, 2018

(54) MANUFACTURING OF SILICON STRAINED IN TENSION ON INSULATOR BY AMORPHISATION THEN RECRYSTALLISATION

(71) Applicant: COMMISSARIAT A L'ENERGIE ATOMIQUE ET AUX ENERGIES ALTERNATIVES, Paris (FR)

(72) Inventors: Shay Reboh, Grenoble (FR); Aurore Bonneviaille, Fountaine (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 5 days.

(21) Appl. No.: 15/490,212

(22) Filed: Apr. 18, 2017

(65) Prior Publication Data
US 2017/0309483 A1 Oct. 26, 2017

(30) Foreign Application Priority Data
Apr. 26, 2016 (FR) ...................... 16 53685

(51) Int. Cl.
| | |
|---|---|
| *H01L 21/266* | (2006.01) |
| *H01L 21/02* | (2006.01) |
| *H01L 21/225* | (2006.01) |
| *H01L 21/265* | (2006.01) |
| *H01L 21/762* | (2006.01) |

(Continued)

(52) U.S. Cl.
CPC .... *H01L 21/02689* (2013.01); *H01L 21/0242* (2013.01); *H01L 21/0245* (2013.01); *H01L 21/02381* (2013.01); *H01L 21/02422* (2013.01); *H01L 21/02532* (2013.01); *H01L 21/2254* (2013.01); *H01L 21/266* (2013.01); *H01L 21/26506* (2013.01); *H01L 21/76224* (2013.01); *H01L 21/76283* (2013.01); *H01L 21/84* (2013.01); *H01L 29/7847* (2013.01)

(58) Field of Classification Search
CPC ............... H01L 21/02689; H01L 21/84; H01L 21/2254; H01L 21/76283; H01L 21/0242; H01L 21/02422; H01L 21/26506; H01L 21/02532; H01L 21/266; H01L 29/7847
See application file for complete search history.

(56) References Cited

U.S. PATENT DOCUMENTS

| | | | | |
|---|---|---|---|---|
| 6,774,015 B1 * | 8/2004 | Cohen | ............... | H01L 21/02381 257/E21.12 |
| 7,915,148 B2 * | 3/2011 | Mantl | ................. | H01L 21/0245 257/18 |

(Continued)

OTHER PUBLICATIONS

U.S. Pat. No. 9,246,006 B2, filed Jan. 26, 2016, Perrine Batude, et al.

(Continued)

*Primary Examiner* — Latanya N Crawford
(74) *Attorney, Agent, or Firm* — Oblon, McClelland, Maier & Neustadt, L.L.P.

(57) ABSTRACT

Method for making a strained silicon structure, wherein a silicon germanium layer is formed on the silicon layer, followed by another layer with a lower concentration of germanium before selective amorphisation of the silicon and silicon germanium layer relative to this other layer before the assembly is recrystallised so as to strain the silicon semiconducting layer.

19 Claims, 12 Drawing Sheets

(51) Int. Cl.
*H01L 21/84* (2006.01)
*H01L 29/78* (2006.01)

(56) References Cited

U.S. PATENT DOCUMENTS

| | | |
|---|---|---|
| 2004/0009626 A1 | 1/2004 | Tweet et al. |
| 2004/0142541 A1* | 7/2004 | Cohen ............... H01L 21/02381 438/479 |
| 2005/0124146 A1 | 6/2005 | Bedell et al. |
| 2009/0298301 A1* | 12/2009 | Mantl ................. H01L 21/0245 438/795 |
| 2012/0068267 A1 | 3/2012 | Bedell et al. |
| 2014/0284769 A1 | 9/2014 | Halimaoui et al. |
| 2015/0179665 A1 | 6/2015 | Reboh et al. |

OTHER PUBLICATIONS

U.S. Appl. No. 14/555,897, filed Nov. 28, 2014, 2015/0155170 A1, Shay Reboh, et al.
U.S. Appl. No. 14/575,329, filed Dec. 18, 2014, 20150179474 A1, Sylvain Maitrejean, et al.
U.S. Appl. No. 14/950,416, filed Nov. 24, 2015, 2016/0149039 A1, Shay Reboh, et al.
U.S. Appl. No. 15/070,781, filed Mar. 15, 2016, 2016/0276494 A1, Sylvain Barraud, et al.
U.S. Appl. No. 15/092,002, filed Apr. 6, 2016, 2016/0300927 A1, Shay Reboh, et al.
U.S. Appl. No. 15/260,767, filed Sep. 9, 2016, 2017/0076944 A1, Emmanuel Augendre, et al.
U.S. Appl. No. 15/261,226, filed Sep. 9, 2016, 2017/0076997 A1, Shay Reboh, et al.
U.S. Appl. No. 15/452,049, filed Mar. 7, 2017, Sylvain Maitrejean, et al.
French Preliminary Search Report dated Nov. 29, 2016 in French Application 16 53685 filed on Apr. 26, 2016.
A. Bonnevialle, et al., "New Insights on Strained-Si on Insulator Fabrication by Top Recrystallization of Amorphized SiGe on SOI", Eurosoi-Ulis, 2015, 4 pgs.
S. Maitrejean, et al., "A New Method to Induce Tensile Stress in Silicon on Insulator Substrate: From Material Analysis to Device Demonstration", ECS Transactions, vol. 66, (4), 2015, 10 pgs.
M. Vos, et al., "Selective amorphization of ion-bombarded SiGe strained-layer superlattices", Applied Physics Letters, vol. 58, (9), 1991, 3 pgs.
T.W. Simpson, et al., "Amorphization threshold in Si-implanted strained SiGe alloy layers", EMRS, 1994, 9 pgs.
T. Tezuka, et al., "Fabrication of strained Si on an ultrathin SiGe-on-insulator virtual substrate with a high-Ge fraction", Appl. Phys. Lett. vol. 79, (12), 2001, 4 pgs.

* cited by examiner

MANUFACTURING OF SILICON STRAINED IN TENSION ON INSULATOR BY AMORPHISATION THEN RECRYSTALLISATION

TECHNICAL DOMAIN AND PRIOR ART

This description applies to the field of structures having a semiconducting layer with a mechanical strain or stress, and more particularly the fabrication of a tensile strained silicon layer that is arranged on an insulating material.

A strained semiconducting layer is made of a material for which the crystalline mesh parameter(s) is (are) longer or shorter than a nominal mesh parameter.

If the deformed mesh parameter is longer than the "natural" parameter of the crystalline material, the material is said to be strained in tension or to be in tensile strain. When the deformed mesh parameter is shorter than the "natural" mesh parameter, the material is said to be strained in compression or in compressive strain.

For some applications, and particularly for the manufacture of transistors, it may be advantageous to include a layer of strained semiconducting material.

A mechanical tensile or compressive strain can be applied to a semiconducting layer to obtain a higher mobility of charge carriers, thus improving the performances of transistor devices formed in such a layer.

The performances of an N type transistor for which the channel region is made of silicon can be improved by imposing a mechanical tensile strain on this region.

One known method for applying tension to a first silicon layer includes the formation of a second silicon germanium layer on this first layer, then making an implantation so as to make the first layer and a lower portion of the second silicon germanium layer amorphous, while keeping a crystalline upper portion of the second layer.

The next step is recrystallisation of the lower portion of the second silicon germanium layer and the first silicon layer, using the upper portion for which the crystalline structure has been kept as the starting area for a recrystallisation front. During this recrystallisation, the second silicon germanium layer at least partially imposes its mesh parameter on the silicon layer, such that the first layer is tensively strained.

Document 2 782 118 A1 presents a method of this type.

It is usually required to keep a good quality non-amorphised crystalline upper portion, so as to obtain a good quality recrystallised material and avoid the creation of defects in the recrystallised material.

However, particularly in the case in which the first layer and the second layer are full wafer, it may be required to keep a thin crystalline upper portion at the same time so that the crystalline upper portion can be effectively relaxed following amorphisation and thus a better strain of the first Si layer can be obtained.

The two criteria mentioned above are difficult to reconcile in that the amorphising implantation tends to create an irregular interface between the upper portion of the crystalline structure and the lower portion made amorphous.

Thus, when it is required to reduce the thickness of the crystalline material too much, there might be a tendency to form amorphous zones on the surface by implantation, that can cause crystalline defects during recrystallisation.

Moreover, an attempt may be made to increase the germanium content in the second layer so as to apply a higher strain to the first Si layer. However, as the germanium concentration increases, this layer has to be made thinner to prevent a plastic relaxation phenomenon during epitaxy of this second layer.

When the second layer is very thin, it becomes difficult to selectively make a lower portion of this layer amorphous and also to keep a crystalline upper portion.

Therefore the problem arises of finding a new method of making a structure with a strained silicon layer that is better with regard to the disadvantages mentioned above.

PRESENTATION OF THE INVENTION

Therefore one purpose of this invention is to make a zone or layer of strained silicon with higher strain and a good crystalline quality.

An embodiment includes a method of making a structure including a strained silicon layer, the method including the following steps:

provide a substrate with at least one region coated with a stack comprising a silicon semiconducting layer, the silicon semiconducting layer itself being coated with a second silicon germanium semiconducting area, the second semiconducting area itself being coated with a third semiconducting area comprising a layer called the "interface delimitation" layer that is in contact with the second semiconducting area and being made of silicon or silicon germanium with a germanium concentration lower than the germanium concentration of the second semiconducting area, make at least one ion implantation so as to make the silicon layer amorphous and thus make the second semiconducting area selectively amorphous relative to the third semiconducting area, a continuous crystalline portion being kept in the third semiconducting area, then recrystallise the second semiconducting area and the silicon semiconducting layer using the continuous crystalline portion of the third semiconducting area as a starting area for a recrystallisation front, the second semiconducting area imposing its mesh parameter on the silicon semiconducting layer so as to strain this silicon semiconducting layer.

The germanium composition of the interface delimitation layer is chosen so as to enable selective amorphisation of the second semiconducting area relative to this layer and thus make it possible to precisely define the interface between a region made amorphous and a crystalline region.

This interface is flatter and is more precisely positioned than in previous methods according to prior art, so that in particular recrystallisation can then be made from a better defined region and consequently the crystalline quality of the strained silicon layer obtained can be improved.

This interface delimitation layer also makes it possible to include a second semiconducting layer with a high germanium concentration, in particular equal to or more than 30%, but without creating a risk of making the entire upper part of the stack amorphous. However, a second semiconducting area with a high germanium concentration can result in a higher strain in the silicon semiconducting layer.

According to an embodiment, the interface delimitation layer itself is coated with a surface layer made of a semiconducting material different from the semiconducting material of the interface delimitation layer.

Preferably, the germanium concentration in said surface layer is less than the germanium concentration in the interface delimitation layer. The surface layer may be made of silicon. Thus, an intact surface layer is kept so that recrystallisation can be made from a good quality crystalline germ.

Thus, the crystalline quality of the strained silicon semiconducting layer is further improved.

As mentioned above, the germanium concentration of the second silicon germanium semiconducting area can be high to achieve a higher strain in the silicon. Preferably the germanium concentration in the second silicon germanium semiconducting area will be between 30% and 60%.

The interface delimitation layer may be made of silicon germanium and have a low germanium concentration, and particularly less than 25%.

Preferably, the interface delimitation layer is made of silicon germanium with a germanium concentration of between 5% and 20%.

After recrystallisation and straining of the silicon semiconducting layer, the method may include the removal of the third semiconducting area and the second semiconducting area.

According to one possible embodiment of the stack a sacrificial semiconducting layer may be formed in the stack, between the silicon semiconducting layer and the second semiconducting area. In this case the method also includes removal of the sacrificial layer after removal of the second semiconducting area. Providing such a sacrificial layer limits the possibility of the silicon layer being contaminated during the amorphisation ion implantation. That contributes to obtaining a strained silicon semiconducting layer with a better crystalline quality.

The sacrificial layer may be made of silicon or silicon germanium with a germanium concentration lower than the germanium concentration of the second semiconducting area.

According to one possible embodiment of the method, the germanium concentration of the second semiconducting area may have a gradient, such that the germanium concentration reduces with increasing distance from the first semiconducting area and with reducing distance from the third semiconducting area.

When the interface delimitation layer is made of $Si_{1-y}Ge_y$, the gradient of the germanium concentration in the second semiconducting area can be such that the Ge concentration reduces from a given value to y as the distance from the silicon layer increases and as the distance from the third semiconducting area reduces.

The silicon semiconducting area is advantageously the surface layer of an SOI substrate comprising an insulating layer on which the silicon semiconducting layer is supported.

Thus, the method can be used to form sSOI type substrate or an SOI substrate comprising a surface silicon layer with a part strained in tension.

According to one possible embodiment of the method, a step to etch the stack down to the insulating layer can be included between step a) and step b), so as to define at least one semiconducting block.

According to one possible embodiment of the method, said amorphisation is done in a first part of the silicon semiconducting layer, while a second part is protected by a mask, the method also including enrichment of the first part in germanium.

Thus, a first part can be made enriched in germanium that could for example by dedicated to the creation of a transistor strained in compression, and a second enriched part strained in tension can be made in the same surface layer of silicon, using the selective implantation and recrystallisation method defined above.

An insulating trench can also be formed between the first part and the second part of the silicon semiconducting layer.

For example, such a trench could be designed to separate one or several N type transistors and one or several P type transistors.

BRIEF DESCRIPTION OF THE DRAWINGS

This invention will be better understood after reading the description of example embodiments given purely for information and in no way limitative with reference to the appended drawings on which.

Figure 1A:
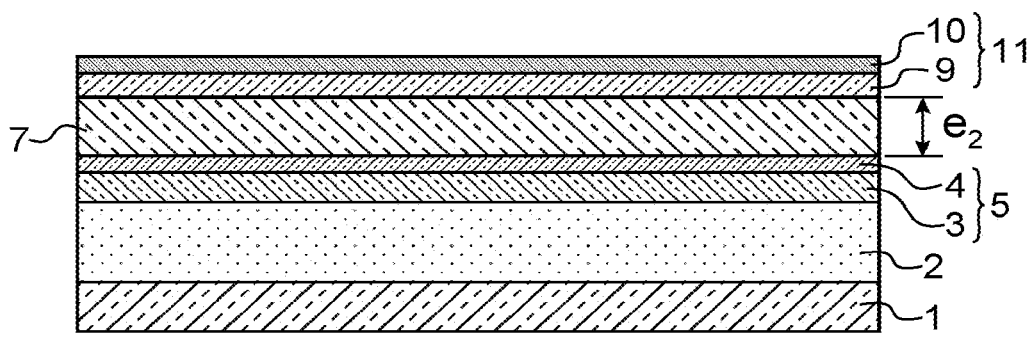
FIGS. 1A-1E illustrate an example of a method of forming a strained semiconducting layer according to one embodiment of this invention.
Figure 1B:
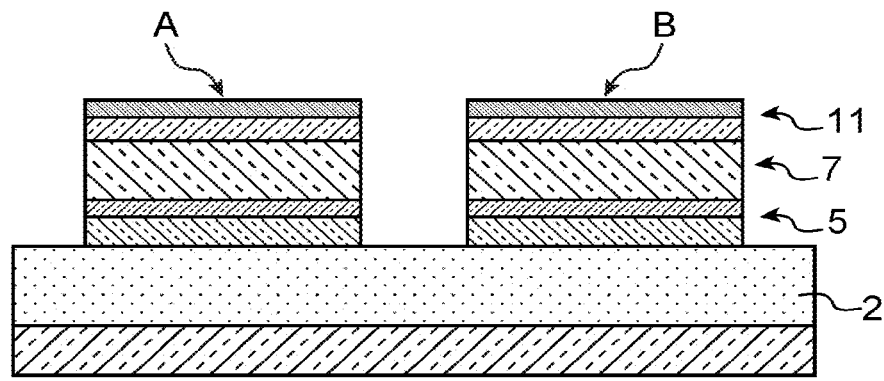

Identical, similar or equivalent parts of the different figures have the same numeric references to facilitate the comparison between different figures.

The different parts shown on the figures are not necessarily all at the same scale, to make the figures more easily understandable.

Furthermore, in the following description, terms or expressions such as "lower", "upper", "surface", "top", "bottom" that depend on the orientation of the structure should be understood assuming that the structure is oriented as shown in the figures.

DETAILED PRESENTATION OF PARTICULAR EMBODIMENTS

We will now describe an example of a method of making a structure comprising a strained silicon on insulator layer, with reference to FIGS. 1A-1E.

The starting material for this method may be a wafer or a substrate of the SOI ("Silicon On Insulator") type, composed of a semiconducting support layer 1 for example made of Si, coated with an insulating layer 2 made for example of $SiO_2$ commonly called BOX ("Buried Oxide"), with a thickness that can vary for example between 20 nm and 150 nm. The insulating layer 2 is itself coated with an "upper"

semiconducting layer 3 based on silicon. It is desired to strain this silicon semiconducting layer 3 in tension. The thickness of the upper semiconducting layer 3 may for example be between 5 nm and 30 nm.

A sacrificial layer 4 can then be formed on at least one region of the upper semiconducting layer 3 of the substrate by epitaxy. In the example in FIG. 1A, the sacrificial layer 4 is based on the same semiconducting material as the upper semiconducting layer 3 of the substrate. Thus, the sacrificial layer 4 may for example be based on silicon and made with a thickness of between 2 nm and 30 nm.

The stack of the upper layer 3 and the sacrificial layer 4 forms a semiconducting area 5 called the "first semiconducting area" with a thickness that may for example be of the order of 9 nm.

The next step is to form a semiconducting mesh parameter adaptation layer 7 on the first semiconducting area 5, based on silicon germanium $Si_{1-x}Ge_x$. This layer 7 that will be called the "second semiconducting area" can be made by epitaxy on the first semiconducting area 5. The material of the second semiconducting area 7 can be made with a mesh parameter different from that of the first semiconducting layer 5. The semiconducting mesh parameter adaptation area 7 is preferably designed to have a high germanium concentration x, in other words such that x is greater than or equal to 0.3, for example x being between 0.3 and 0.6.

Preferably, the thickness of the second semiconducting zone 7, $e_2$, is less than a critical plastic relaxation thickness hc as described in the document entitled: "Critical thickness for plastic relaxation of SiGe" by Hartmann et al. Journal of Applied Physics 2011. This critical thickness hc depends on the germanium concentration in the semiconducting area 7 and can be defined by the limiting thickness beyond which the second semiconducting area 7 does not relax plastically on the silicon layer 3. The thickness $e_2$ for a germanium concentration of the order of 40% may for example be between 25 nm and 30 nm.

A third semiconducting area 11 is then formed on the second semiconducting area 7. The third semiconducting area 11 is designed based on a semiconducting material with a germanium concentration less than the germanium concentration of the second semiconducting area 7, and particularly sufficiently lower than that of the second semiconducting area 7 such that selective amorphisation of the second semiconducting area 7 relative to the third semiconducting area 11 can be made by ion implantation. The layer 9 formed on and in contact with the second semiconducting area 7 may thus be made of silicon or silicon germanium with a germanium concentration lower than the germanium concentration of the second semiconducting area 7.

In the particular embodiment illustrated on FIG. 1A, the third semiconducting area 11 is formed from several layers including a layer 9 that will be called the "interface delimitation" layer made of $Si_{1-y}Ge_y$ with a germanium concentration y such that x-y is preferably greater than 0.2 and is deposited on and in contact with the second semiconducting area 7. The germanium concentration y in the interface delimitation layer 9 is preferably low, in other words it is such that y is less than or equal to 0.20, where y is for example between 0.05 and 0.20. The thickness of the layer 9 made of $Si_{1-y}Ge_y$ is preferably less than the critical relaxation thickness hc mentioned above and that depends on its germanium concentration y. For example, the thickness of the interface delimitation layer 9 may be between 3 nm and 15 nm.

In this example embodiment, the third semiconducting area 11 also includes a surface layer 10 made of a semiconducting material different from the semiconducting material from which the interface delimitation layer 9 is made.

In particular, the germanium concentration in said surface layer 10 is less than the germanium concentration in the interface delimitation semiconducting layer 9.

The surface layer 10 may advantageously be made of silicon and may for example be between 2 nm and 5 nm thick.

FIG. 1A illustrates an example of a stack made in full wafer.

However, the stack of layers that has just been described can be formed on a local area on the substrate.

The stack of semiconducting areas 5, 7, 11 can then be etched so as to form distinct semiconducting blocks A, B. This etching can be done as far as the insulating layer 2 of the substrate.

In one embodiment, blocks A, B are created with a length L such that $L<10*e_2$, where $e_2$ is the thickness of the $2^{nd}$ semiconducting area 7.

The second semiconducting area 7 and the first semiconducting area 5 are then amorphised. This is done making one or several ion implantations.

The implantation dose and energy are selected so as to amorphise the semiconducting areas 5 and 7 while keeping a crystalline structure of the third semiconducting area 11. Such amorphisation selectivity is obtained particularly due to the difference in the germanium concentration x-y between the second semiconducting area 7 and the third semiconducting area 11. For example, this amorphisation selectivity is described in document: "*Amorphization threshold in Si implanted strained SiGe alloy layers*", by T. W. Simpson et al., EMRS 94, Boston.

An expert in the subject can obtain experimental curves for a given difference in the Ge concentration to determine the dose, the energy and the implantation temperature at which selective amorphisation can be obtained.

In particular, for a fixed dose and energy, the temperature of the substrate can be adapted to modify the amorphisation selectivity.

For example, the document by Simpson referenced above gives temperature and dose windows so that $Si_{1-x}Ge_x$ with x=0.35 can be selectively amorphised relative to Si or $Si_{1-x}Ge_x$ with x=0.35 can be selectively amorphised relative to $Si_{1-y}Ge_y$ with y=0.15.

Figure 10A:
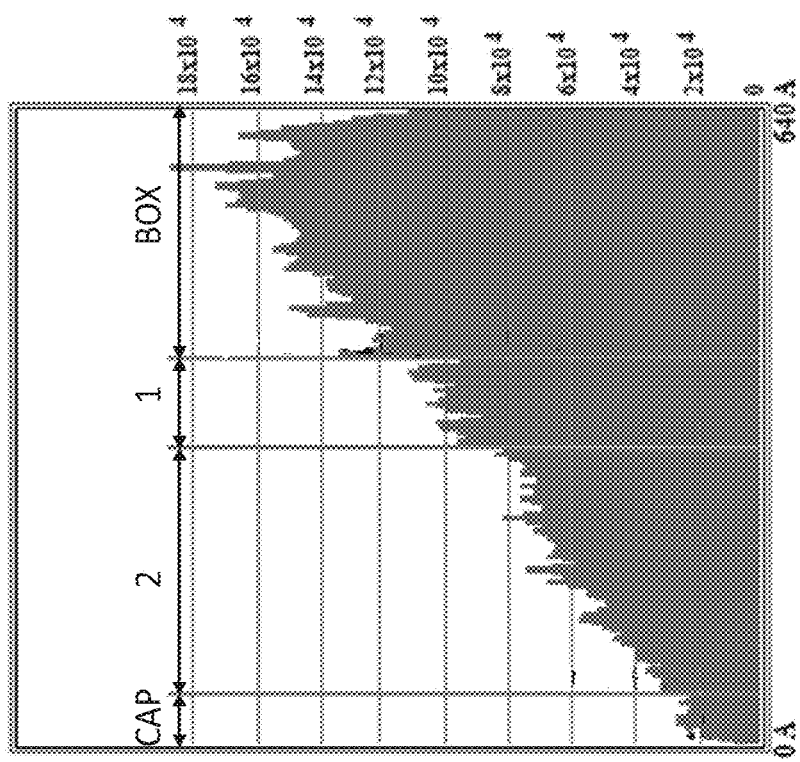
FIGS. 10A and 10B are graphic representations of an Si implantation profile at energies of 30 keV and 40 keV respectively, according to one embodiment of this invention; more specifically, said figures show an implantation profile in a structure comprising, starting from its exposed face and working in the direction of the implantation depth, a 5 nm thick silicon layer (denoted CAP), a 25 nm thick SiGe layer (containing 40% Ge) (denoted 2), a 9 nm thick silicon layer (denoted 1), and a 25 nm thick silicon oxide layer (denoted BOX). The vertical axis represents a concentration of implanted species (in atoms per cm3) as a function of an implantation depth on the horizontal axis (in Angstroms).
Figure 10B:
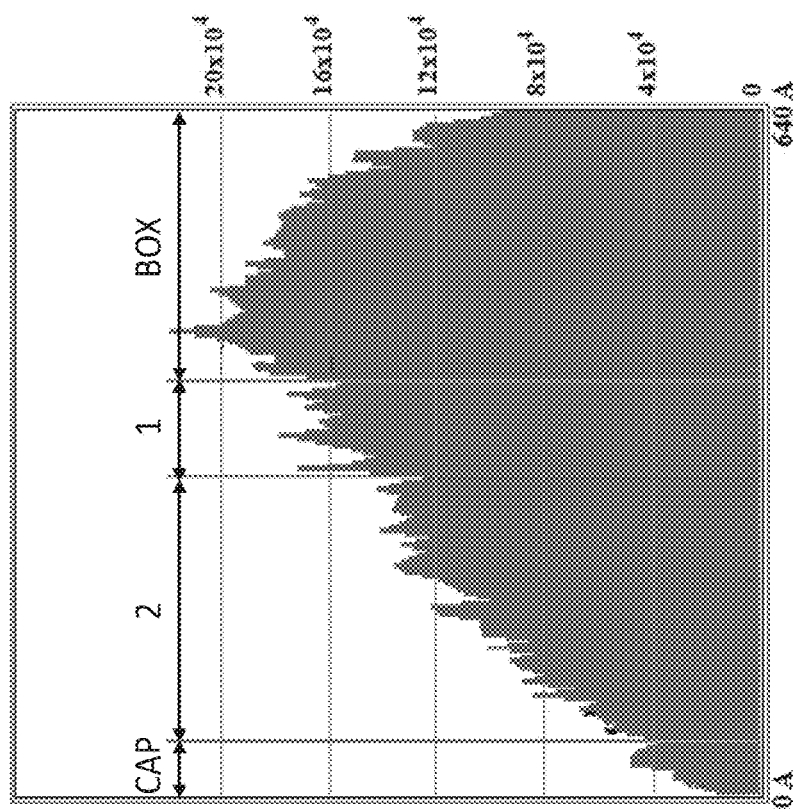

For example, FIGS. 10A and 10B represent simulations of silicon implantation profiles in a structure (along the vertical axis, expressed in Atoms per cm$^3$) as a function of an implantation depth at implantation energies of 30 keV and 40 keV respectively, as a function of the implantation depth (along the horizontal axis and expressed in Angstroms). In this example, the structure, starting from its exposed face and working in the direction of the implantation depth, comprises a 5 nm thick silicon layer (called the third region and denoted CAP on FIGS. 10A and 10B), a 25 nm thick SiGe layer (containing 40% Ge) (called the second region and denoted 2 on FIGS. 10A and 10B), a 9 nm thick silicon layer (called the first region and denoted 1 on FIGS. 10A and 10B), and a 25 nm thick silicon oxide layer (denoted BOX on FIGS. 10A and 10B).

A concentration of implanted species is much higher in region 1 than in the CAP region, thus demonstrating that the first region can be selectively amorphised relative to the CAP region.

The species used to make the first semiconducting area 5 and the second semiconducting area 7 amorphous may for example be Si.

Figure 1C:
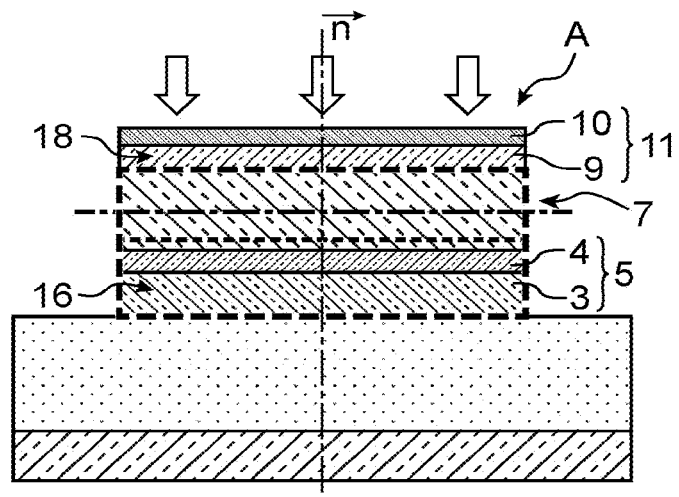

In the example embodiment illustrated on FIG. 1C, the ion implantation(s) is (are) used in the semiconducting block A such that the first silicon semiconducting area 5 and the second semiconducting area 7 are made completely amorphous over their entire thickness, in other words until reaching the insulating layer 2 of the substrate. Since the compositions in germanium are different in the second semiconducting area 7 and the semiconducting interface delimitation layer 9, the interface between the amorphous region 16 and the crystalline region 18 is between the second semiconducting area 7 and the third semiconducting area 11. The addition of the semiconducting interface delimitation layer 9 into the stack thus makes it possible to clearly define the interface between the amorphous material and the crystalline material.

In particular, this interface is precisely positioned, so that a continuous thin crystalline region, for example thinner than 10 nm, can be kept on the stack surface.

The fact of having a precisely positioned interface also makes it possible to design the second semiconducting area 7 with a higher germanium concentration so that the silicon semiconducting layer 3 can be strained more later.

The next step is recrystallisation by SPER (Solid-Phase Epitaxial Regrowth) of the region made amorphous making use of a portion of the third area 11 for which the crystalline structure was kept as a starting area for a recrystallisation front.

The presence of the silicon surface layer 10 in the third semiconducting area 11 can improve the quality of the recrystallised material as long as this surface layer 10 is above the interface between the amorphous area and the crystalline area and is therefore kept intact. The semiconducting region that acts as a germ for starting recrystallisation is thus continuous. Recrystallisation is done using at least one thermal annealing. This annealing can be done at a temperature between 450° C. and 800° C. for a duration between several seconds when a high temperature is chosen and several hours when a lower temperature is used. For example, annealing can be done at a temperature of 700° C. for a duration of the order of 30 minutes.

Figure 1D:
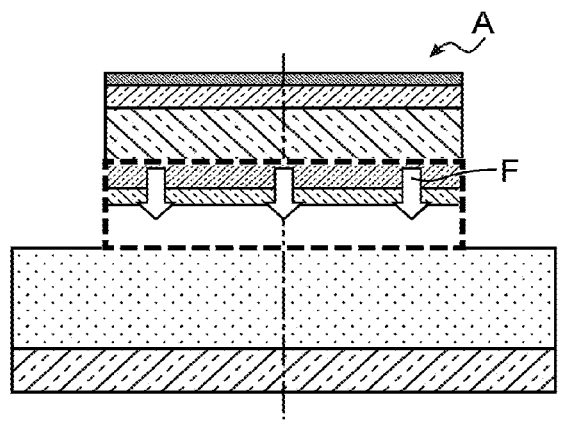

FIG. 1D shows the structure during recrystallisation with a recrystallisation front F advancing in the vertical direction from top to bottom towards the insulating layer 2 of the substrate. Having made the first semiconducting area 5 amorphous as far as the insulating layer 2 of the substrate avoids the presence of another recrystallisation front advancing from bottom to top in the direction opposite to the direction of front F. This thus avoids a meeting between recrystallisation fronts propagating in opposite directions that could well create defects so that strained silicon cannot be obtained.

The second semiconducting area 7 imposes its mesh parameter on the first semiconducting area 5 due to its greater thickness and/or its germanium concentration higher than that of the third semiconducting area 11. The mesh parameter of $Si_{1-x}Ge_x$ can thus be at least partially imposed on the Si to obtain a silicon semiconducting area 5 strained in tension.

Once recrystallisation has been done, the third semiconducting area 11 and the second semiconducting area 7 are removed. The interface delimitation layer 9 and the second semiconducting area 7 are removed, for example using HCl when they are made of silicon germanium.

Figure 1E:
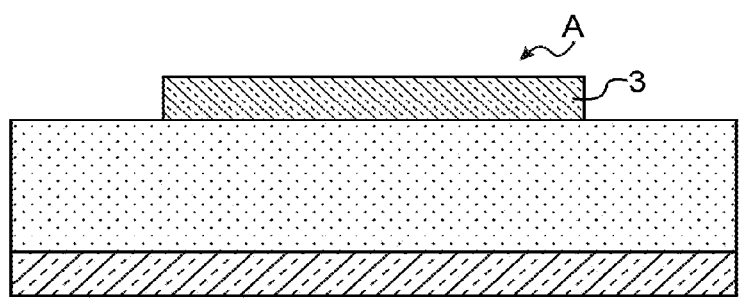
Figure 2:
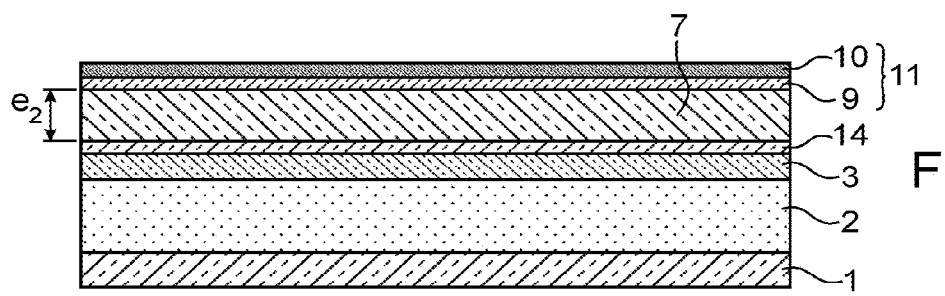
FIG. 2 illustrates a variant of the method.
Figure 3:
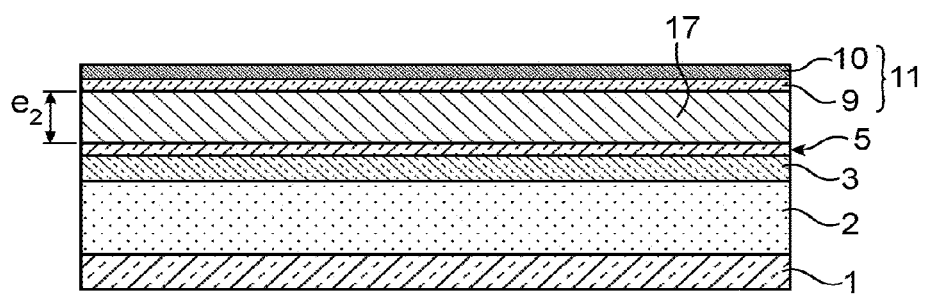
FIG. 3 illustrates another variant of the method.

The sacrificial semiconducting layer 4 can also be removed. A good quality semiconducting layer 3 made of silicon strained in tension can thus be kept in position on and in contact with the insulating layer 2 of the substrate (FIG. 1E).

One or several electronic components such as transistors, particularly of the NMOS type, can then be formed in this layer 3 of silicon strained in tension.

One particular example embodiment of the method described above includes an SOI substrate with an upper layer 3 and a sacrificial layer made of Si with a combined thickness of 9 nm, a semiconducting silicon germanium mesh parameter adaptation layer 7 with a germanium concentration of 40% and a thickness of between 25 nm and 30 nm, a silicon germanium interface delimitation layer 9 with a germanium concentration of 15% and a thickness of between 10 nm and 15 nm, and a Si surface layer 10 between 3 nm and 5 nm thick. In this case, the amorphisation implantation can be made with Si at 40 keV, at a dose of between 2 and $2.5 \times 10^{14}$ at*cm$^{-2}$ with a beam inclination equal to 0° from a normal. The recrystallisation annealing is then done at a temperature of 850° C. for a duration of 15 s.

A variant of the example embodiment described above includes the formation of a sacrificial layer 14 made of silicon germanium on the silicon semiconducting layer 3 that will be strained in tension. In this case, the sacrificial layer 14 preferably has a low concentration of germanium, for example between 5% and 20% and its thickness is less than the plastic relaxation thickness he mentioned above, for example with a thickness of between 2 nm and 15 nm.

Another variant of each of the embodiments described above allows for the formation of a second semiconducting area 17 made of $Si_{1-x}Ge_x$ but in this case with a gradient of the germanium concentration such that this concentration x reduces between an area in contact with the first semiconducting area 5 and an area in contact with the third semiconducting area 11.

In other words, the germanium concentration of the second semiconducting area 17 reduces as the distance from the silicon layer 3 to be strained increases. The germanium concentration x of the second semiconducting area 17 can also be varied to reduce from a given value to y, where y is the germanium concentration of the interface delimitation layer 9.

Figure 4:
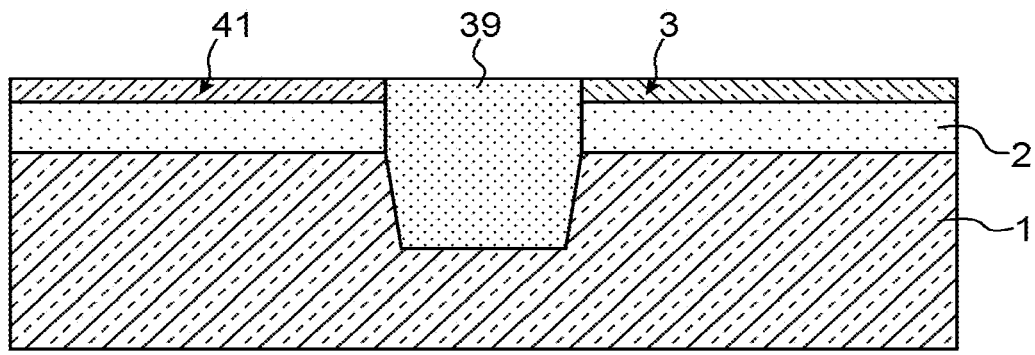
FIG. 4 illustrates an example of a semiconductor on insulator substrate provided with a semiconducting layer comprising a strained silicon part and a part enriched in germanium.

In the example embodiment illustrated in FIG. 4, the semiconducting layer 3 based on silicon that is strained in tension using a method like that described above is directly supported on the insulating layer 2 of a semiconductor on insulator type substrate and is formed in a region dedicated to the creation of one or several NMOS type transistors. This substrate also comprises another layer 41 of a different semiconducting material in another region dedicated to the creation of one or several PMOS type transistors. The layer 41 is also positioned on and in contact with the insulating layer 2 of the substrate and is typically based on silicon germanium, advantageously strained in compression.

The semiconducting layer 3 based on silicon strained in tension is separate from the silicon germanium layer 41 strained in compression due to an insulation area 39, for example of the STI ("Shallow Trench Isolation") type passing through the thickness of the substrate.

An example embodiment of such a device will now be described with reference to FIGS. 5A-5I.

Figure 5A:
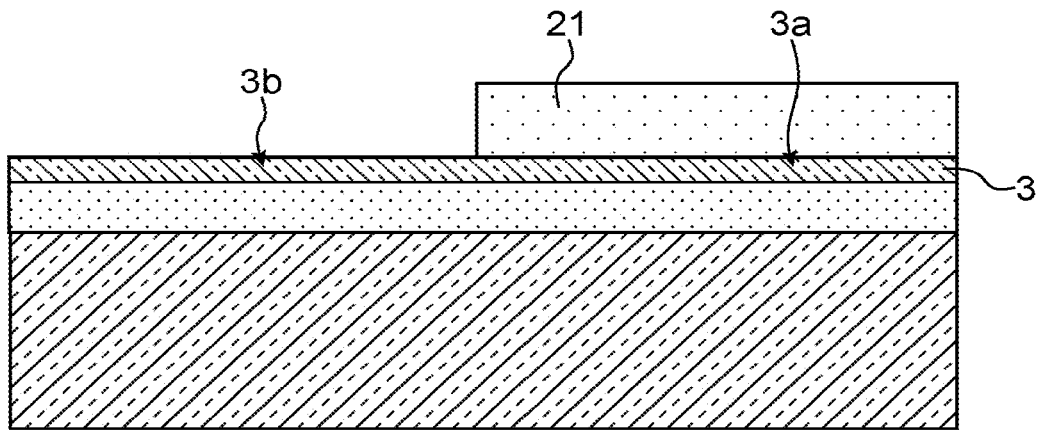
FIGS. 5A-5I illustrate an example method of making a device like that shown on FIG. 4.

A mask 21, for example made of silicon nitride, is made on a region 3a of a silicon layer 3 of an SIO substrate dedicated to the formation of at least one N type transistor (FIG. 5A).

Figure 5B:
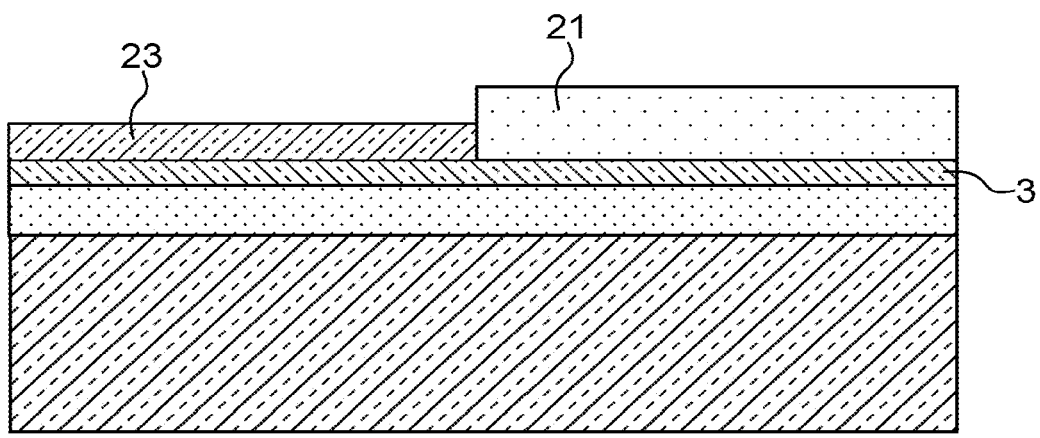

The mask 21 can be formed by the deposition of a nitride layer and then photolithography of this nitride layer using a photosensitive resin mask. A silicon germanium area 23 is then grown by epitaxy on another region 3b of the silicon layer 3 that is exposed and is not protected by the mask 21 (FIG. 5B).

The next step is a germanium condensation method also called germanium enrichment of region 3b of the semiconducting layer 3.

Germanium enrichment of region 3b can be done for example using a technique called "germanium condensation" as described for example in the document entitled "Fabrication of strained Si on an ultrathin SiGe on Insulator virtual substrate with a high Ge fraction", Appl. Phys. Lett. 79, 1798, 2001, by Tezuka et al. or in the document entitled "the Ge condensation technique: a solution for planar SOI/GeOI co-integration for advanced CMOS technologies", Materials Science in Semiconductor Processing 11 (2008) 205-213, by Damlencourt & al.

Another possible means of germanium enrichment consists of making an SiGe deposit and then making a diffusion annealing in order to mix Si and Ge.

The mask 21 protects the region 3a during the enrichment step.

Figure 5C:
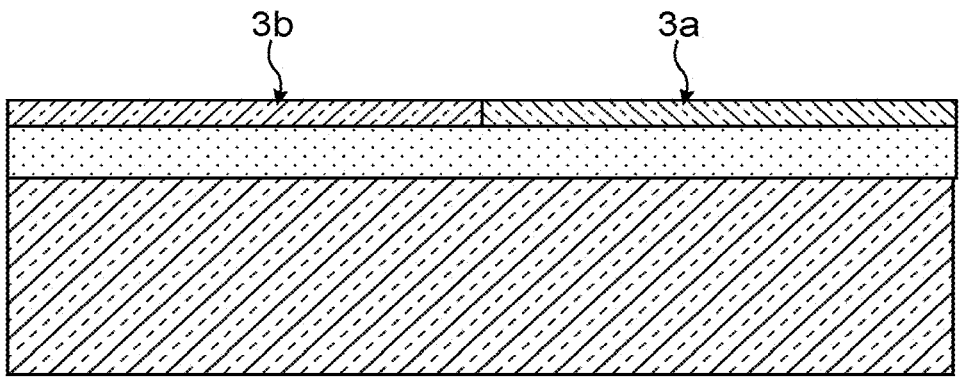

The result obtained is thus a silicon region 3a and a silicon germanium region 3b on the same substrate. The mask 21 is then removed, for example by RIE etching when the mask 21 is made of nitride (FIG. 5C).

Another mask 25, for example made of silicon nitride, is then formed on the silicon germanium region 3b, while the silicon region 3a dedicated to the N type transistor is exposed. This other mask 25 can be made by the deposition of a nitride layer and then photolithography of this nitride layer using a photosensitive resin mask. A silicon germanium area 27 is then grown by epitaxy on region 3a of the silicon layer 3 that is exposed and not protected by this other mask 25. The silicon germanium area 27 preferably has a high germanium content, and particularly between 30% and 60%.

Figure 5D:
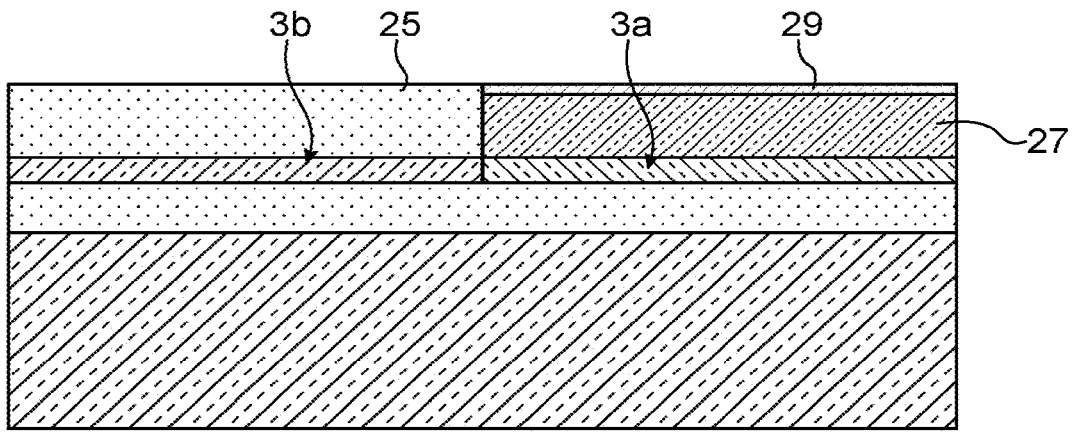

An interface definition layer 29 is then formed on the silicon germanium area 27. The germanium concentration y of the interface delimitation layer 29 is preferably less than or equal to 0.20 and its thickness is less than the critical relaxation thickness hc (FIG. 5D).

Figure 5E:
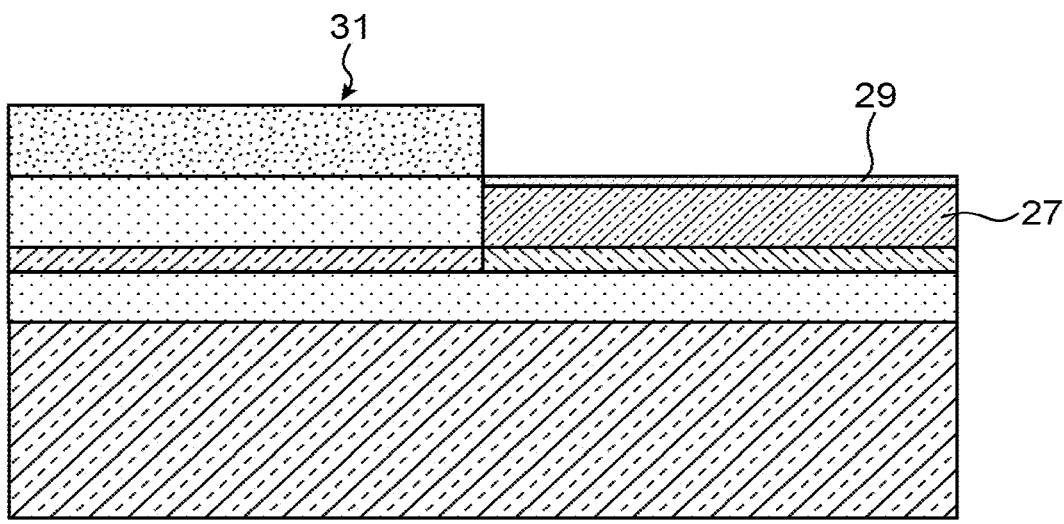

A protection block 31 is then made facing the region 3b dedicated to the P type transistor. This protection block may for example be made of silicon oxide (FIG. 5E).

Figure 5F:
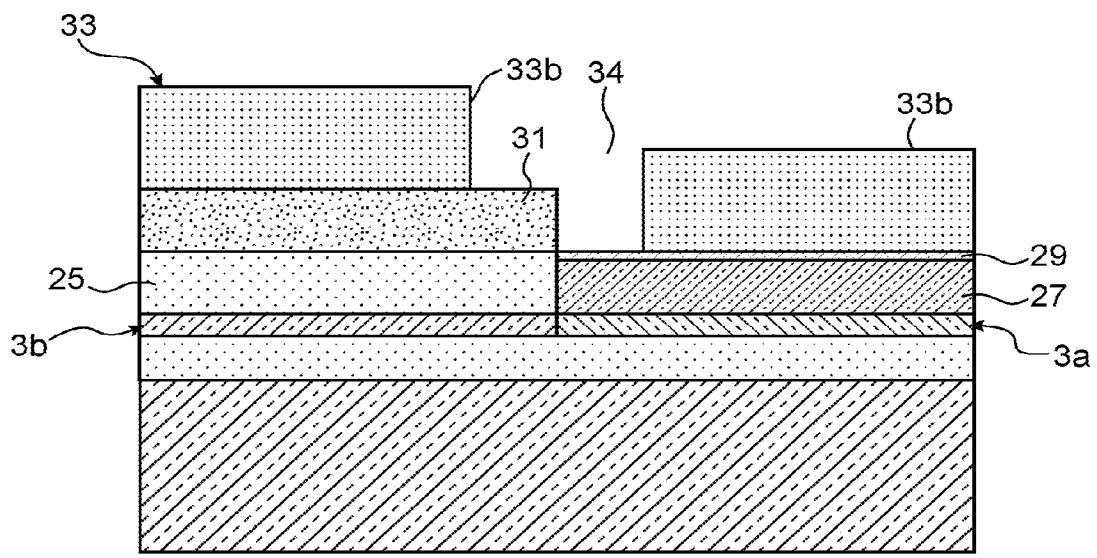

A resin mask 33 is then formed, part 33a of which extends on a portion of the protection block 31 and facing the region 3b dedicated to the P type transistor, and another part 33b extends on the interface delimitation layer 29 a portion of the protection block 31 and facing the region 3b dedicated to the N type transistor. The resin mask 33 comprises an opening 34 between the parts 33a and 33b and that extends both facing region 3a designed to hold an N type transistor and facing region 3b designed to hold a P type transistor (FIG. 5F).

Portions of the protection block 31 and the mask 25 are then etched, with areas of the delimitation layer 29 and the semiconducting area 27 that extend in the opening 34 of the resin mask 33. For example, this etching may be done using anisotropic RIE etching.

Figure 5G:
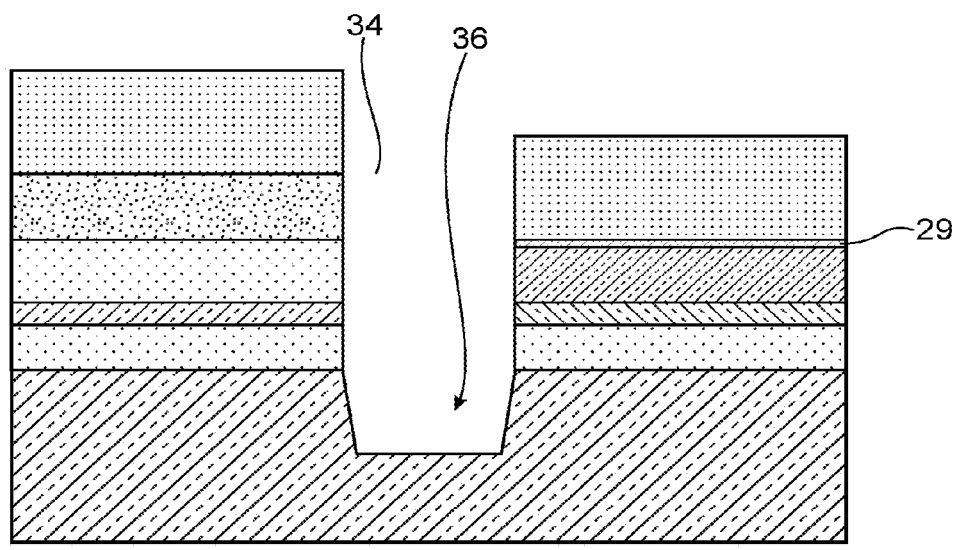

The opening 34 is then prolonged as far as the substrate to form a separation trench 36 between regions 3a, 3b dedicated to the N type transistor and to the P type transistor respectively, this trench 36 then passing through the insulating layer of the substrate and extending into the substrate support layer (FIG. 5G).

Figure 5H:
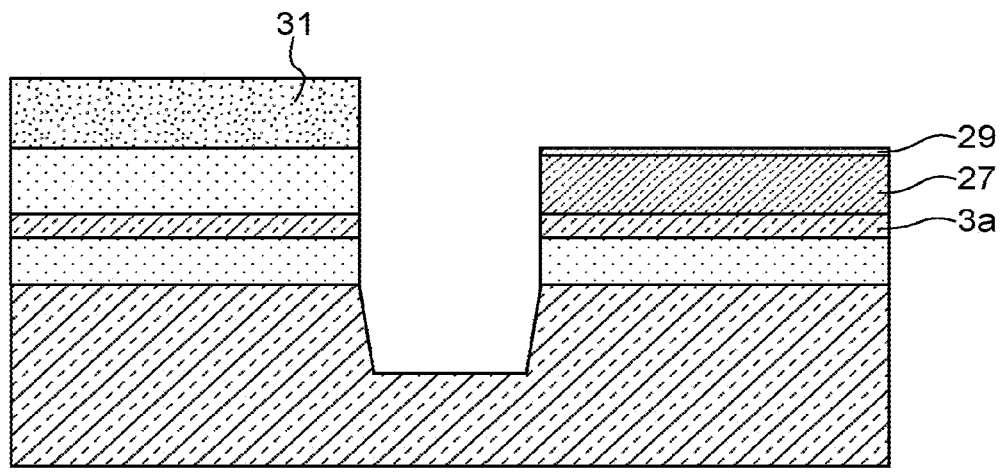

The resin mask 33 is then removed, for example using a stripping method (FIG. 5H).

The region 3a of the silicon layer 3 dedicated to the formation of an N type transistor is then tensively strained using a method like that described previously with reference to FIGS. 1C and 1D, during which the second semiconducting area 27 and the region 3a of the silicon semiconducting layer 3 are selectively amorphised, using one or several ion implantations, for example using Si as the implanted species. The semiconducting interface delimitation layer 29 in the stack helps to precisely position the interface between a region that is to be kept crystalline and the region that has been made amorphous.

The protection block 31 and the mask 25 that protect the region 3b dedicated to making the P type transistor from the ion implantation(s), are then removed.

The next step is SPER (Solid-Phase Epitaxial Regrowth).

Once the semiconducting region 3a has been tensively strained, the trench 36 can be filled in with a dielectric material, for example $SiO_2$, so as to form an STI type isolating area 39 separating the region 3b dedicated to the P type transistor and comprising a semiconducting material strained in compression, from region 3a dedicated to the P type transistor and comprising a semiconducting material strained in tension.

Figure 5I:
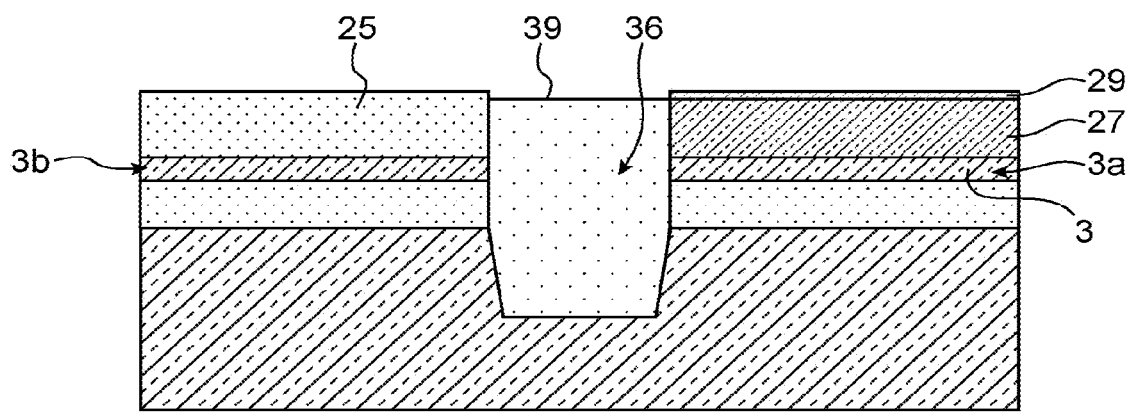

After filling, a CMP planarising or polishing step can be performed so as to remove excess dielectric material. The protection block 31 can be removed at the same time (FIG. 5I).

The interface definition layer 29 can then be removed, the SiGe semiconducting area 27 having been used to tension the region 3a of the silicon layer 3. This removal can be made by etching, for example using HCl. During this etching, the mask 25 can be designed to protect the region 3b dedicated to the type P transistor.

The order in which the region 3b strained in compression and the region 3a strained in tension are made can be different from the order in the previously described example.

Figure 6A:
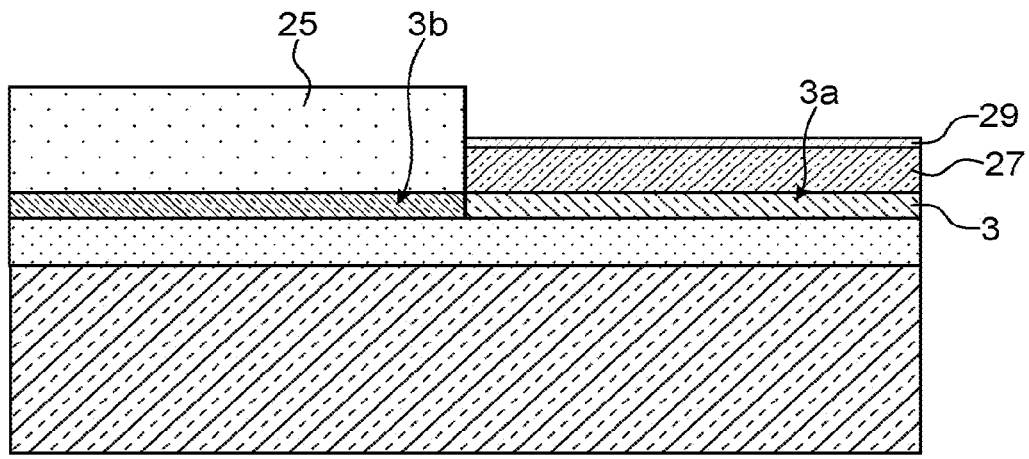
FIGS. 6A-6D illustrate a variant of the method of making a device with a silicon semiconducting layer comprising a strained silicon part and a part enriched in germanium.

According to one variant of the method illustrated on FIGS. 6A-6D, a mask 25 is made, for example made of nitride on the region 3b dedicated to the P type transistor, then a silicon germanium area 27 is formed on the region 3A of the silicon layer 3 that is exposed and is not protected by this mask 25. An interface definition layer 29 is then formed on the silicon germanium area 27 (FIG. 6A).

The region 3a of the silicon layer 3 dedicated to the formation of an N type transistor is then tensively strained using a method like that described above with reference to FIGS. 1C and 1D, in which the second semiconducting area 27 and the region 3a of the silicon semiconducting layer 3 are selectively amorphised, using one or several ion implantations. The next step is SPER (Solid-Phase Epitaxial Regrowth) so as to obtain a silicon region strained in tension.

Figure 6B:
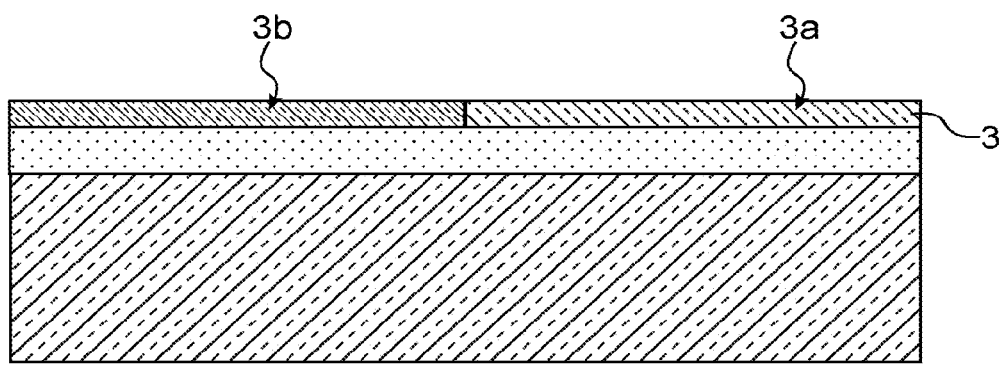

The interface definition layer 29 is then removed from the silicon germanium area 27. The mask 25 formed facing the region 3b dedicated to the P type transistor is then removed (FIG. 6B).

Figure 6C:
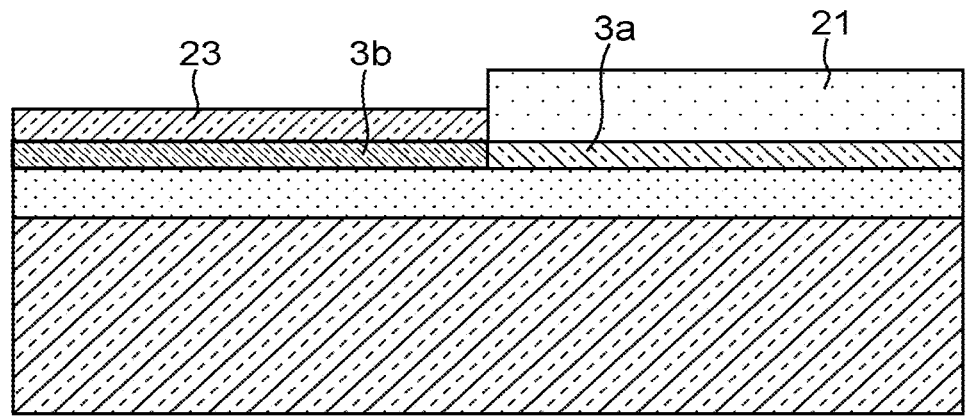

A mask 21, for example made of silicon nitride, is then made on the region 3a of a silicon layer 3 strained in tension. A silicon germanium area 23 is then grown by epitaxy on the region 3b of the silicon layer 3 that is exposed and is not protected by the mask 21 (FIG. 6C).

Figure 6D:
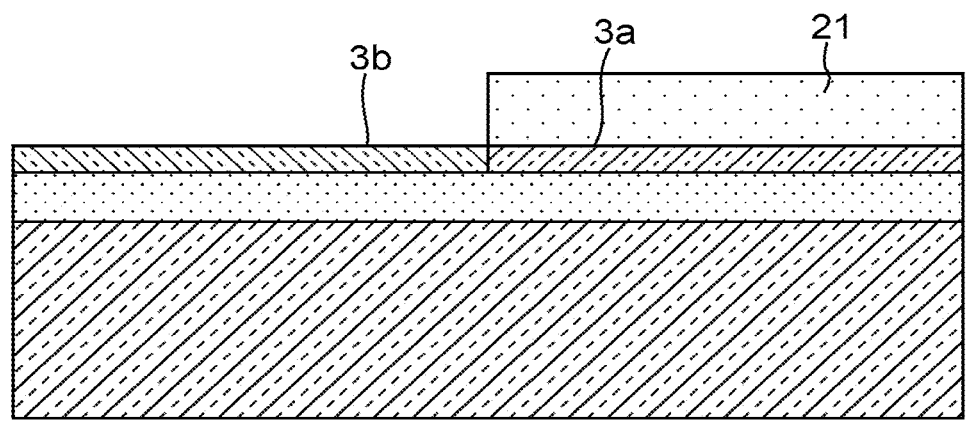

The next step is enrichment in germanium of the region 3b so as to obtain a region 3b strained in compression (FIG. 6D).

We have already mentioned an example embodiment in which the silicon layer is not strained in full wafer but in a semiconductor block A, B, for example with a parallelepiped shape that is etched. The dimensions of this block depend on the state of stress that can be obtained in the silicon layer 3.

Figure 7:
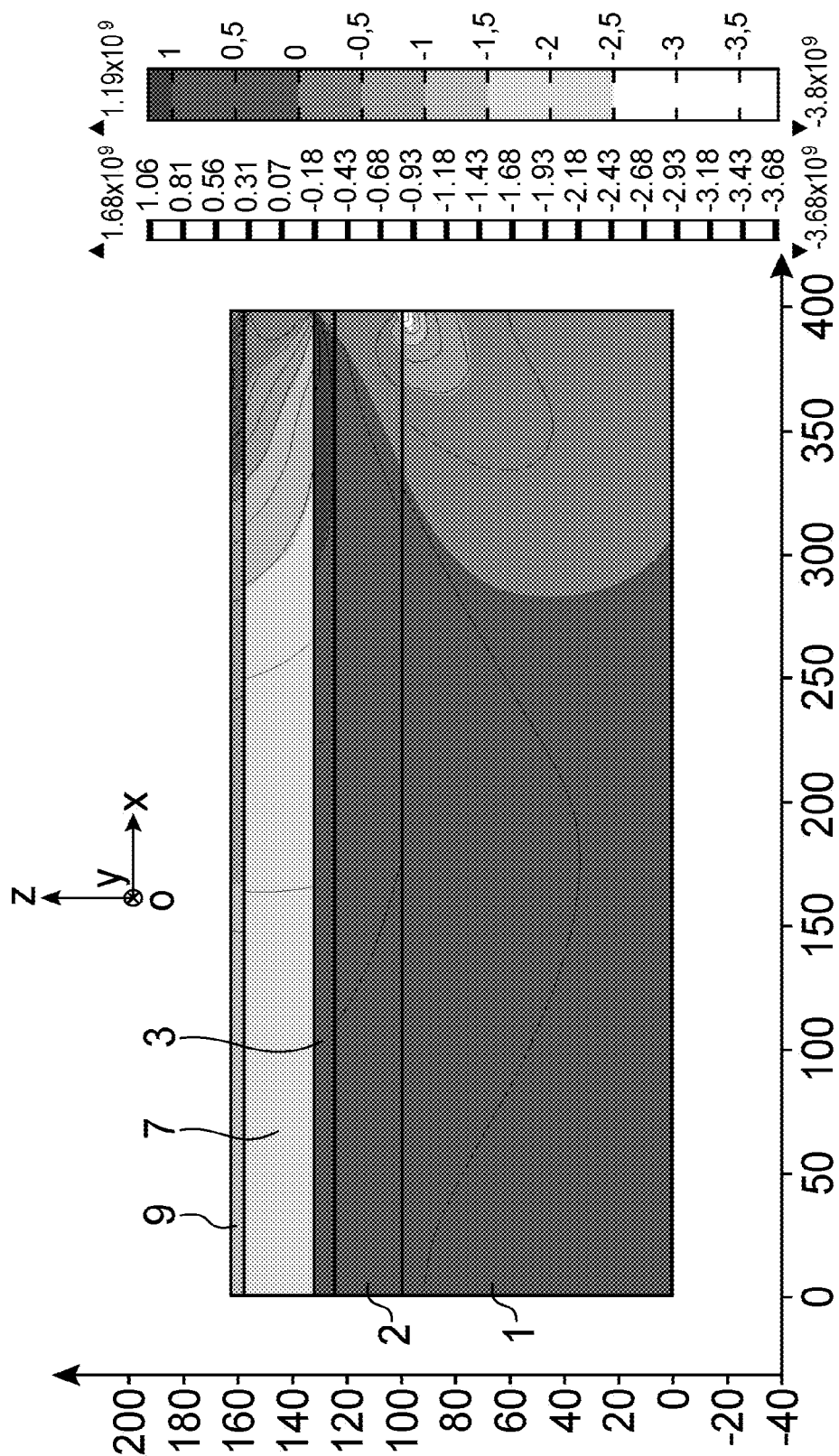
FIGS. 7 to 9 show different results of a simulation of a state of strain in a silicon layer forming part of a stack of the type shown in FIG. 1B and strained by amorphisation and recrystallisation steps, the simulation taking account of the difference in mesh parameter between an SiGe upper layer after structuring and a relaxed Si layer.

FIG. 7 contains a 2D simulation example obtained using digital simulation software based on the finite elements method such as COMSOL Multiphysics® that is susceptible in a block comprising an 8 nm thick silicon layer 3, the strained silicon layer 3 is supported on a 25 nm BOX layer 2, itself placed on a silicon substrate layer. The strained silicon layer 3 is itself coated with a second 30 nm thick SiGe semiconducting area 7 with a germanium concentration of 30%, while the second semiconducting layer 7 supports a 5 nm thick SiGe interface adaptation layer 9 with a germanium concentration of 15%. Only half the block is shown on this figure, with a right end corresponding to the free end of the block and a left end corresponding to the centre of the block. This figure is representative of the difference in mesh parameter of the upper SiGe layer 15% after structuring.

Figure 8:
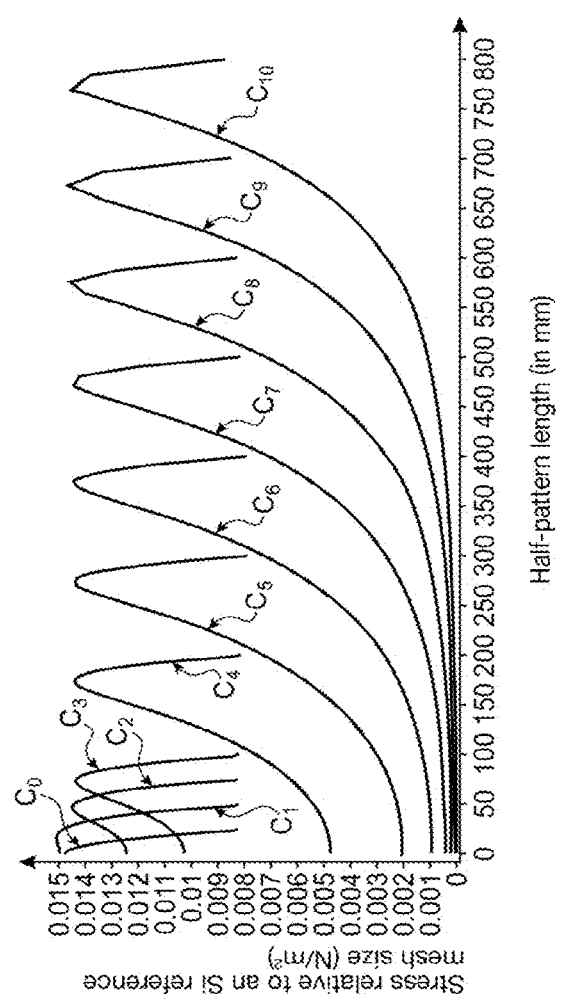

FIG. 8 shows different example stress profiles $C_0$, $C_1$, $C_2$, $C_3$, $C_4$, $C_5$, $C_6$, $C_7$, $C_8$, $C_9$, $C_{10}$, in the layer 11 for a silicon reference mesh for block lengths 50 nm, 100 nm, 150 nm, 200 nm, 400 nm, 600 nm, 800 nm, 1 µm, 1.2 µm, 1.4 µm, 1.6 µm respectively, for the stack discussed with reference to FIG. 7. The results are obtained by a 2D calculation using a plane stress approximation and assuming a width W very much larger than the length L of the blocks.

Once again on this figure, the profiles are produced on half a block, a left end of a profile corresponding to the centre of the block while a right end corresponds to a free edge of the block. In this case the length L is a dimension measured in a direction parallel to the direction y of an orthogonal coordinate system [O; x; y; z] shown on FIG. 7.

Figure 9:
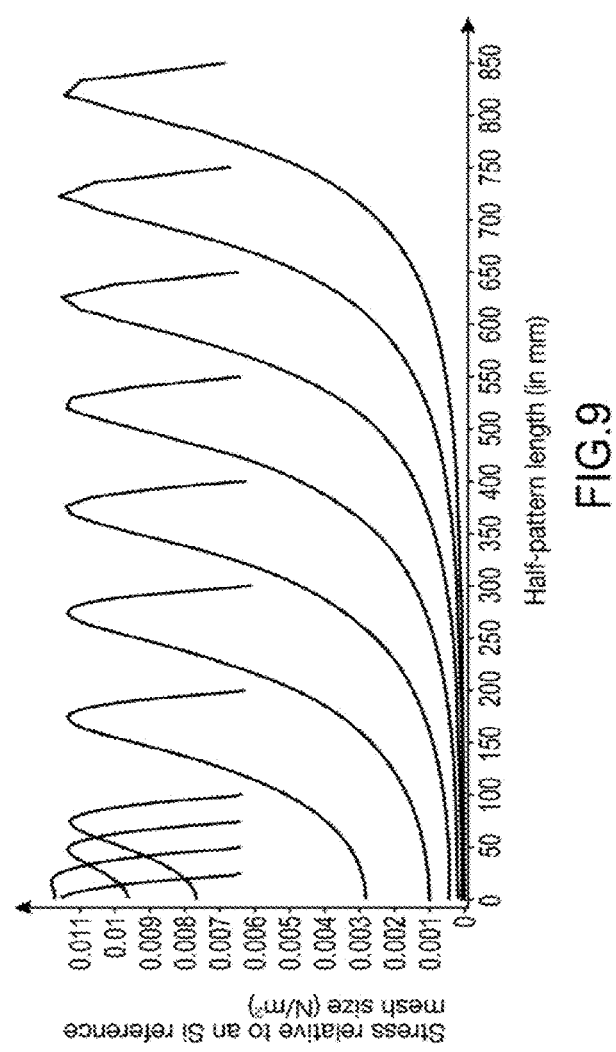

In the simulation result illustrated on FIG. 9, the width (dimension measured parallel to a direction x of the orthonormal coordinate system [O; x; y; z] is varied, the stress profiles $C'_0$, $C'_1$, $C'_2$, $C'_3$, $C'_4$, $C'_5$, $C'_6$, $C'_7$, $C'_8$, $C'_9$, $C'_{10}$, in the layer 3 for a silicon reference mesh for block widths of 50 nm, 100 nm, 150 nm, 200 nm, 400 nm, 600 nm, 800 nm, 1 µm, 1.2 µm, 1.4 µm, 1.6 µm. Once again, the profiles shown are produced over a half block.

The results are obtained by a 2D calculation using a plane stress approximation and assuming a width W very much smaller than the length L of the blocks.

The invention claimed is:

1. A method for making a structure comprising a strained silicon layer, the method comprising:
    providing a substrate that has at least one region coated with a stack comprising a silicon semiconducting layer, the silicon semiconducting layer itself being coated with a second semiconducting area comprising silicon germanium, the second semiconducting area itself being coated with a third semiconducting area comprising an interface delimitation layer that is in contact with the second semiconducting area, the interface delimitation layer being made of silicon or silicon germanium with a germanium concentration lower than a germanium concentration of the second semiconducting area;
    making at least one ion implantation such that the silicon semiconducting layer and the second semiconducting area are selectively amorphised, while keeping a continuous crystalline portion in the third semiconducting area; and then
    recrystallising the second semiconducting area and the silicon semiconducting layer using the continuous crystalline portion of the third semiconducting area as a starting area for a recrystallisation front, the second semiconducting area imposing its parameter on the silicon semiconducting layer so as to strain the silicon semiconducting layer.

2. The method according to claim 1, wherein the interface delimitation layer is coated with a surface layer made of a different semiconducting material from the semiconducting material of the interface delimitation layer.

3. The method according to claim 2, wherein the surface layer is made of silicon.

4. The method according to claim 1, wherein the germanium concentration of the second semiconducting area is between 30% and 60%.

5. The method according to claim 1, wherein the interface delimitation layer is made of silicon germanium, and the germanium concentration of the interface delimitation layer is between 5% and 20%.

6. The method according to claim 1, further comprising:
    removing the third semiconducting area and the second semiconducting area after the silicon semiconducting layer is recrystallised and strained.

7. The method according to claim 6, wherein the stack further comprises a sacrificial semiconducting layer intermediate between the silicon semiconducting layer and the second semiconducting area, and
    the method further comprises removing the sacrificial semiconducting layer after the second semiconducting area is removed.

8. The method according to claim 7, wherein the sacrificial semiconducting layer is made of silicon germanium with a germanium concentration lower than the germanium concentration of the second semiconducting area.

9. The method according to claim 1, wherein the germanium concentration of the second semiconducting area has a gradient, the germanium concentration reducing with increasing distance from the silicon semiconducting layer and with reducing distance from the third semiconducting area.

10. The method according to claim 9, wherein the interface delimitation layer is made of $Si_{1-y}Ge_y$ in which y is its Ge concentration, the germanium concentration gradient in the second semiconducting area reducing to the Ge concentration y.

11. The method according to claim 1, wherein the silicon semiconducting layer is a surface layer of an SOI substrate comprising an insulating layer on which the silicon semiconducting layer is supported.

12. The method according to claim 11, further comprising:
    etching the stack down to the insulating layer after providing the substrate and before making the at least one ion implantation, so as to define at least one semiconducting block.

13. The method according to claim 1, wherein the amorphisation is done in a first part of the silicon semiconducting layer, while a second part is protected by a mask, and
    the method further comprises enriching the first part in germanium.

14. The method according to claim 13, wherein an insulating trench is formed between the first part and the second part.

15. The method according to claim 1, wherein the ion implantation is conducted such that the silicon semiconducting layer and the second semiconducting area are amorphised over their entire thicknesses.

16. The method according to claim 15, wherein the second semiconducting area has a thickness less than a critical plastic relaxation thickness hc defined by the limit thickness beyond which the second semiconducting area does not relax plastically on the silicon semiconducting layer.

17. A method for making a structure comprising a strained silicon layer, the method comprising:

providing a substrate that has at least one region coated with a stack comprising a silicon semiconducting layer, the silicon semiconducting layer itself being coated with a second semiconducting area comprising silicon germanium, the second semiconducting area itself being coated with a third semiconducting area comprising an interface delimitation layer that is in contact with the second semiconducting area, the interface delimitation layer being made of silicon or silicon germanium with a germanium concentration y which is lower than a germanium concentration x of the second semiconducting area, the interface delimitation layer being made of $Si_{1-y}Ge_y$ having a germanium concentration y≥0 such that x-y is greater than 0.2, making at least one ion implantation such that the silicon semiconducting layer and the second semiconducting area are selectively amorphised, while keeping a continuous crystalline portion in the third semiconducting area; and then recrystallising the second semiconducting area and the silicon semiconducting layer using the continuous crystalline portion of the third semiconducting area as a starting area for a recrystallisation front, the second semiconducting area imposing its parameter on the silicon semiconducting layer so as to strain the silicon semiconducting layer.

18. A method for making a structure comprising a strained silicon layer, the method comprising:

providing a substrate that has at least one region coated with a stack comprising a silicon semiconducting layer, the silicon semiconducting layer itself being coated with a second semiconducting area comprising silicon germanium, the second semiconducting area itself being coated with a third semiconducting area comprising an interface delimitation layer that is in contact with the second semiconducting area, the interface delimitation layer being made of silicon or silicon germanium with a germanium concentration lower than a germanium concentration of the second semiconducting area, wherein the stack further comprises a sacrificial semiconducting layer intermediate between the silicon semiconducting layer and the second semiconducting area, the sacrificial semiconducting layer being made of silicon germanium with a germanium concentration lower than the germanium concentration of the second semiconducting area;

making at least one ion implantation such that the silicon semiconducting layer and the second semiconducting area are selectively amorphised, while keeping a continuous crystalline portion in the third semiconducting area; and then recrystallising the second semiconducting area and the silicon semiconducting layer using the continuous crystalline portion of the third semiconducting area as a starting area for a recrystallisation front, the second semiconducting area imposing its parameter on the silicon semiconducting layer so as to strain the silicon semiconducting layer.

19. The method according to claim 2, wherein the semiconducting material of the surface layer has a lower germanium concentration than the germanium concentration of the interface delimitation layer.

* * * * *

UNITED STATES PATENT AND TRADEMARK OFFICE
CERTIFICATE OF CORRECTION

PATENT NO. : 10,115,590 B2
APPLICATION NO. : 15/490212
DATED : October 30, 2018
INVENTOR(S) : Shay Reboh et al.

Page 1 of 1

It is certified that error appears in the above-identified patent and that said Letters Patent is hereby corrected as shown below:

On the Title Page

Item (72), the 2$^{nd}$ Inventor's information is incorrect. Item (72) should read:
--(72) Inventors: Shay Reboh, Grenoble (FR);
                 Aurore Bonneviaille, Fontaine (FR)--

Signed and Sealed this
Seventeenth Day of September, 2019

Andrei Iancu
*Director of the United States Patent and Trademark Office*